(12) United States Patent
Price et al.

(10) Patent No.: US 7,876,246 B1
(45) Date of Patent: Jan. 25, 2011

(54) PHOTONIC ANALOG-TO-DIGITAL CONVERTER

(75) Inventors: Alistair J. Price, Ellicott City, MD (US); Raymond Zanoni, Columbia, MD (US); Peter J. Morgan, Glenelg, MD (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 51 days.

(21) Appl. No.: 12/456,932

(22) Filed: Jun. 24, 2009

(51) Int. Cl.
*H03M 1/06* (2006.01)
(52) U.S. Cl. .................. 341/118; 341/137; 341/155
(58) Field of Classification Search ............... 341/118, 341/137, 155
See application file for complete search history.

(56) References Cited

U.S. PATENT DOCUMENTS

| | | | | |
|---|---|---|---|---|
| 6,118,396 A | * | 9/2000 | Song ........................ 341/137 |
| 6,525,682 B2 | * | 2/2003 | Yap et al. ................... 341/137 |
| 6,661,361 B1 | * | 12/2003 | Lewis et al. ................ 341/137 |
| 6,700,517 B1 | * | 3/2004 | Kellar ....................... 341/137 |

* cited by examiner

*Primary Examiner*—Khai M Nguyen
(74) *Attorney, Agent, or Firm*—Matthew J. Evans; Daniel M. Barbieri

(57) ABSTRACT

A monitoring device in an analog-to-digital converter, the monitoring device including a monitoring module configured to receive a first radio frequency signal provided by a first radio frequency modulator and a second radio frequency signal provided by a second radio frequency modulator. The first radio frequency signal being associated with a laser data and a radio frequency input signal. The laser data being associated with a radio frequency oscillator signal. The second radio frequency signal being associated with the laser signal and the radio frequency oscillator signal. The monitoring module is configured to determine a modification factor based on the first radio frequency signal and the second radio frequency signal.

20 Claims, 10 Drawing Sheets

PHOTONIC ANALOG-TO-DIGITAL CONVERTER

BACKGROUND

The present disclosure relates generally to the field of analog-to-digital converters. Specifically, the present disclosure relates to a system for and method of improving the performance of an analog-to-digital converter.

An analog-to-digital converter converts continuous signals to discrete digital numbers. The analog-to-digital converter converts an analog input (e.g., voltage, current, etc.) to a digital number. Analog-to-digital converters have performance concerns such as jitter.

Jitter is the time variation of a characteristic of a periodic signal in electronics and telecommunications, often in relation to a reference clock source. Jitter may be observed in characteristics such as the frequency of successive pulses, the signal amplitude, or phase of periodic signals. Jitter is a significant, and undesired factor in the design of almost all communications links (e.g., USB, PCI-e, SATA, OC-48).

In clock recovery applications, jitter is often referred to as timing jitter. Jitter can be quantified in the same terms as all time-varying signals (e.g., RMS, or peak-to-peak displacement). Also like other time-varying signals, jitter can be expressed in terms of spectral density (frequency content).

Jitter period can refer to the interval between two times of maximum effect (or minimum effect) of a signal characteristic that varies regularly with time. Jitter frequency may be the inverse of the jitter period. Jitter may decrease the effective number of bits ("ENOB") for the system.

What is needed is an analog-to-digital converter with improved jitter characteristics. There is also a need for an analog-to-digital converter system that is less susceptible to jitter or other time variations. Further, there is also a need for an analog-to-digital converter including a monitoring device to mitigate jitter effects. It would be desirable to provide a system and/or method that provides one or more of these advantages features.

SUMMARY

One embodiment of the disclosure relates to a monitoring device in an analog-to-digital converter. The monitoring device including a monitoring module configured to receive a first radio frequency data provided by a first radio frequency modulator and a second radio frequency data provided by a second radio frequency modulator. The first radio frequency data being associated with a laser data and a radio frequency input data. The laser data being associated with a radio frequency oscillator data. The second radio frequency data being associated with the laser data and the radio frequency oscillator data. The monitoring module being configured to determine a modification factor based on the first radio frequency data and the second radio frequency data. It should be noted that data may be a signal, a sample, or any other type of data.

Another embodiment of the disclosure relates to a method for monitoring data in an analog-to-digital converter. The method including providing a radio frequency oscillator data to a laser source and a reference radio frequency modulator. The method further including providing laser data from the laser source to a radio frequency modulator and the reference radio frequency modulator. In addition, the method includes providing a radio frequency input data to the radio frequency modulator and generating a radio frequency modulator data. The method includes generating a reference radio frequency modulator data and comparing the reference radio frequency modulator data to the radio frequency modulator data. Further, the method includes determining a modification data based on a comparison of the reference radio frequency modulator data to the radio frequency modulator data.

Yet, another embodiment of the disclosure relates to a monitoring device in an analog-to-digital converter. The monitoring device includes means for providing a radio frequency oscillator data to a laser source and a reference radio frequency modulator. The monitoring device includes means for providing laser data from the laser source to a radio frequency modulator and the reference radio frequency modulator. In addition, the monitoring device includes means for providing a radio frequency input data to the radio frequency modulator and means for generating a radio frequency modulator data. Further, the monitoring device includes means for generating a reference radio frequency modulator data and means for comparing the reference radio frequency modulator data to a reference data. The monitoring device includes means for determining a modification data based on a comparison of the reference radio frequency modulator data to the reference data.

DETAILED DESCRIPTION OF THE EXEMPLARY EMBODIMENTS

Although the description below contains many specificities, these specificities are utilized to illustrate some of the exemplary embodiments of this disclosure and should not be construed as limiting the scope of the disclosure. The scope of this disclosure should be determined by the claims, their legal equivalents and the fact that it fully encompasses other embodiments which may become apparent to those skilled in the art. A method or device does not have to address each and every problem to be encompassed by the present disclosure. All structural, chemical and functional equivalents to the elements of the below-described disclosure that are known to those of ordinary skill in the art are expressly incorporated herein by reference and are intended to be encompassed by the present claims. A reference to an element in the singular is not intended to mean one and only one, unless explicitly so stated, but rather it should be construed to mean at least one. No claim element herein is to be construed under the provisions of 35 U.S.C. §112, sixth paragraph, unless the element is expressly recited using the phrase "means for." Furthermore, no element, component or method step in the present disclosure is intended to be dedicated to the public, regardless of whether the element, component or method step is explicitly recited in the claims.

Figure 1A:
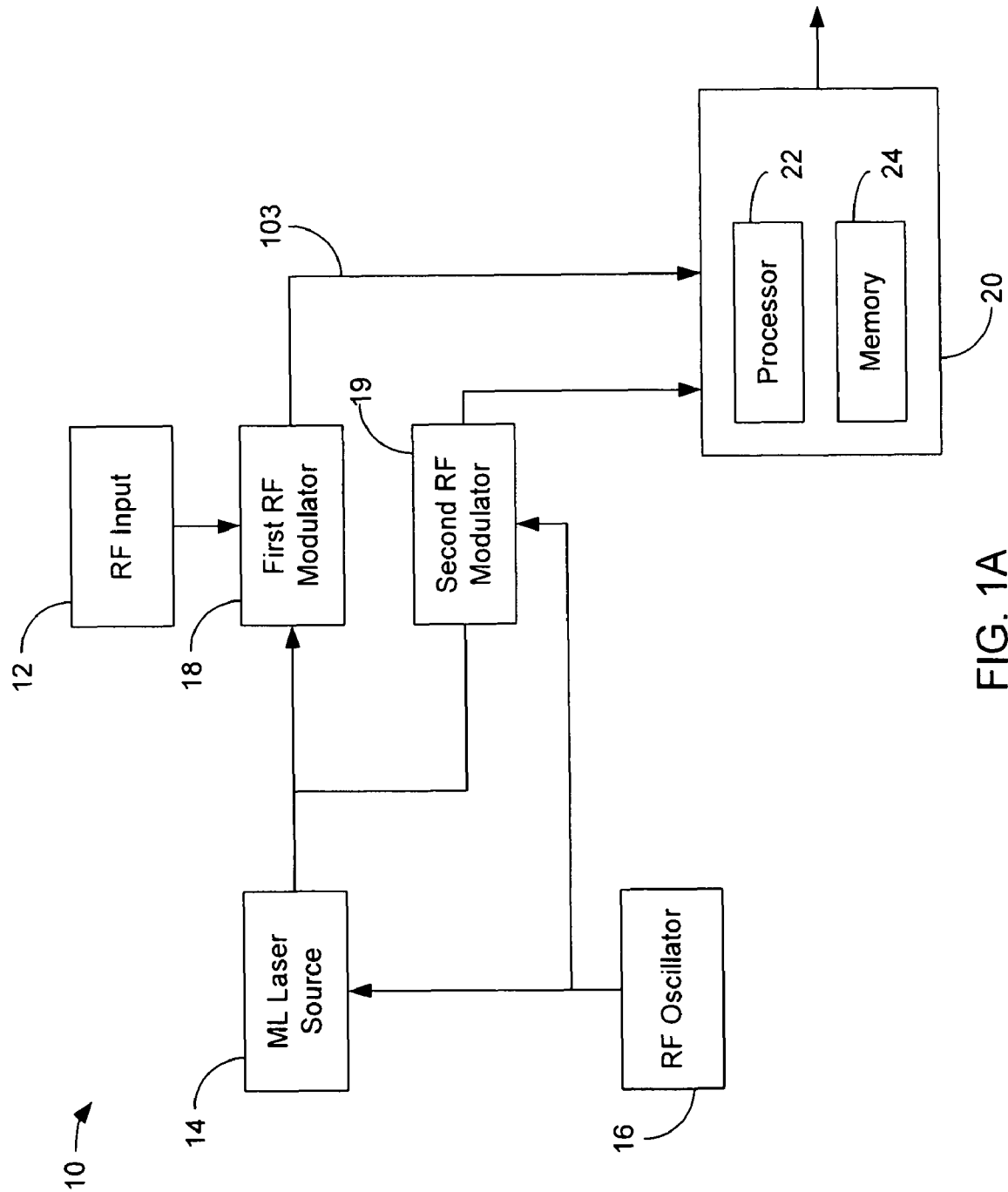
FIG. 1A is a block diagram of the analog-to-digital converter, according to one exemplary embodiment.

Referring to FIG. 1A, a block diagram of an analog-to-digital converter 10 is shown, according to one exemplary embodiment. Analog-to-digital converter 10 may include a mode lock laser source 14, a radio frequency oscillator 16, a first radio frequency modulator 18, a second radio frequency modulator 19, and a monitoring device 20, according to an exemplary embodiment. Monitoring device 20 may include a processor 22 and a memory 24, according to an exemplary embodiment. Radio frequency oscillator 16 may transmit a wave pattern (e.g., sawtooth wave, sine wave, etc.) to mode lock laser source 14 and second radio frequency modulator 19. Mode lock laser source 14 may transmit a signal to first radio frequency modulator 18 and second radio frequency modulator 19. The signal transmitted by mode lock laser source 14 may be based on or modified by the wave pattern transmitted from radio frequency oscillator 16 and received by mode lock laser source 14. In another exemplary embodiment, the signal transmitted by mode lock laser source 14 may not be based on or modified by the wave pattern transmitted from radio frequency oscillator 16 and received by mode lock laser source 14. A radio frequency input 12 may be received by first radio frequency modulator 18, according to an exemplary embodiment. First radio frequency modulator 18 may transmit a signal to monitoring device 20 based on radio frequency input 12 and the data received by first radio frequency modulator 18 from mode lock laser source 14, according to an exemplary embodiment. Second radio frequency modulator 19 may transmit a reference signal to monitoring device 20 based on the wave pattern received from the radio frequency oscillator 16 and the signal received from mode lock laser source 14. Monitoring device 20 may utilize a module to determine a modification factor. The module may be embodied in software or language. In one embodiment, the module may include processor 22 and/or memory 24 to process the signal received from first radio frequency modulator 18 and the reference signal received from second radio frequency modulator 19 to determine modification data. The term radio frequency may include frequencies up to 10 s of GHz. Processor 22 may be embodied as a digital signal processor, an ASIC, a programmable logic device, or any integrated circuit device.

Figure 1B:
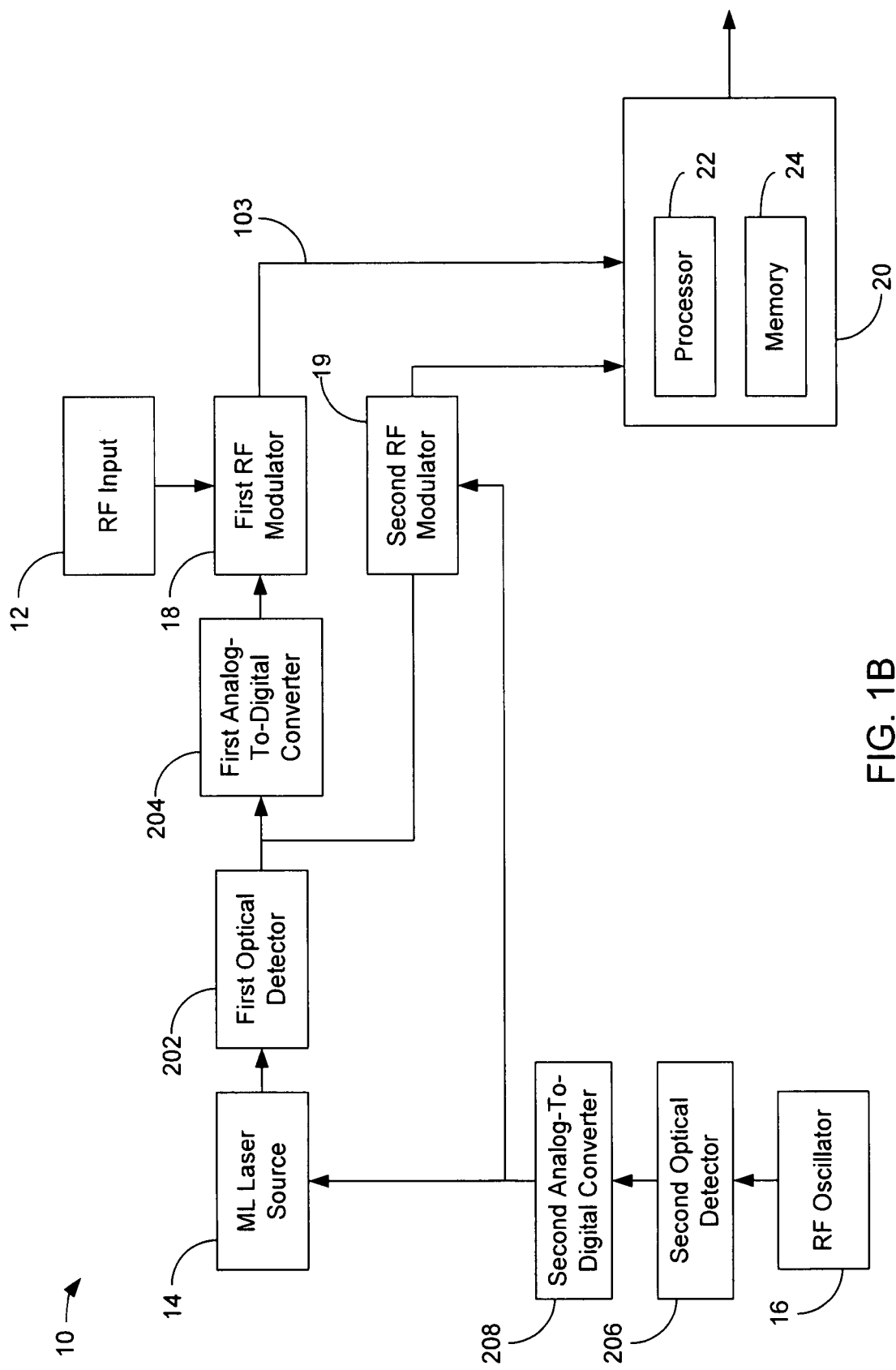
FIG. 1B is another block diagram of the analog-to-digital converter, according to one exemplary embodiment.

Referring to FIG. 1B, another block diagram of analog-to-digital converter 10 is shown, according to one exemplary embodiment. Analog-to-digital converter 10 may include mode lock laser source 14, radio frequency oscillator 16, first radio frequency modulator 18, second radio frequency modulator 19, and monitoring device 20, according to an exemplary embodiment. Monitoring device 20 may include processor 22 and memory 24, according to an exemplary embodiment. Radio frequency oscillator 16 may transmit a wave pattern (e.g., sawtooth wave, sine wave, etc.) to mode lock laser source 14 and second radio frequency modulator 19. In an exemplary embodiment, the wave pattern transmitted by radio frequency oscillator 16 may be via a second optical detector 206 and a second analog-to-digital converter 208. Mode lock laser source 14 may transmit a signal to first radio frequency modulator 18 and second radio frequency modulator 19. The signal transmitted by mode lock laser source 14 may be based on or modified by the wave pattern transmitted from radio frequency oscillator 16 and received by mode lock laser source 14. In an exemplary embodiment, the signal transmitted by mode lock laser source 14 to first radio frequency modulator 18 may be via a first optical detector 202 and a first analog-to-digital converter 204. In another exemplary embodiment, the signal transmitted by mode lock laser source 14 may not be based on or modified by the wave pattern transmitted from radio frequency oscillator 16 and received by mode lock laser source 14. Radio frequency input 12 may be received by first radio frequency modulator 18, according to an exemplary embodiment. First radio frequency modulator 18 may transmit a signal to monitoring device 20 based on radio frequency input 12 and the data received by first radio frequency modulator 18 from mode lock laser source 14, according to an exemplary embodiment. Second radio frequency modulator 19 may transmit a reference signal to monitoring device 20 based on the wave pattern received from the radio frequency oscillator 16 and the signal received from mode lock laser source 14. Monitoring device 20 may utilize a module to determine a modification factor. The module may be embodied in software or language. In one embodiment, the module may include processor 22 and/or memory 24 to process the signal received from first radio frequency modulator 18 and the reference signal received from second radio frequency modulator 19 to determine modification data. The term radio frequency may include frequencies up to 10 s of GHz. Processor 22 may be embodied as a digital signal processor, an ASIC, a programmable logic device, or any integrated circuit device.

Figure 2:
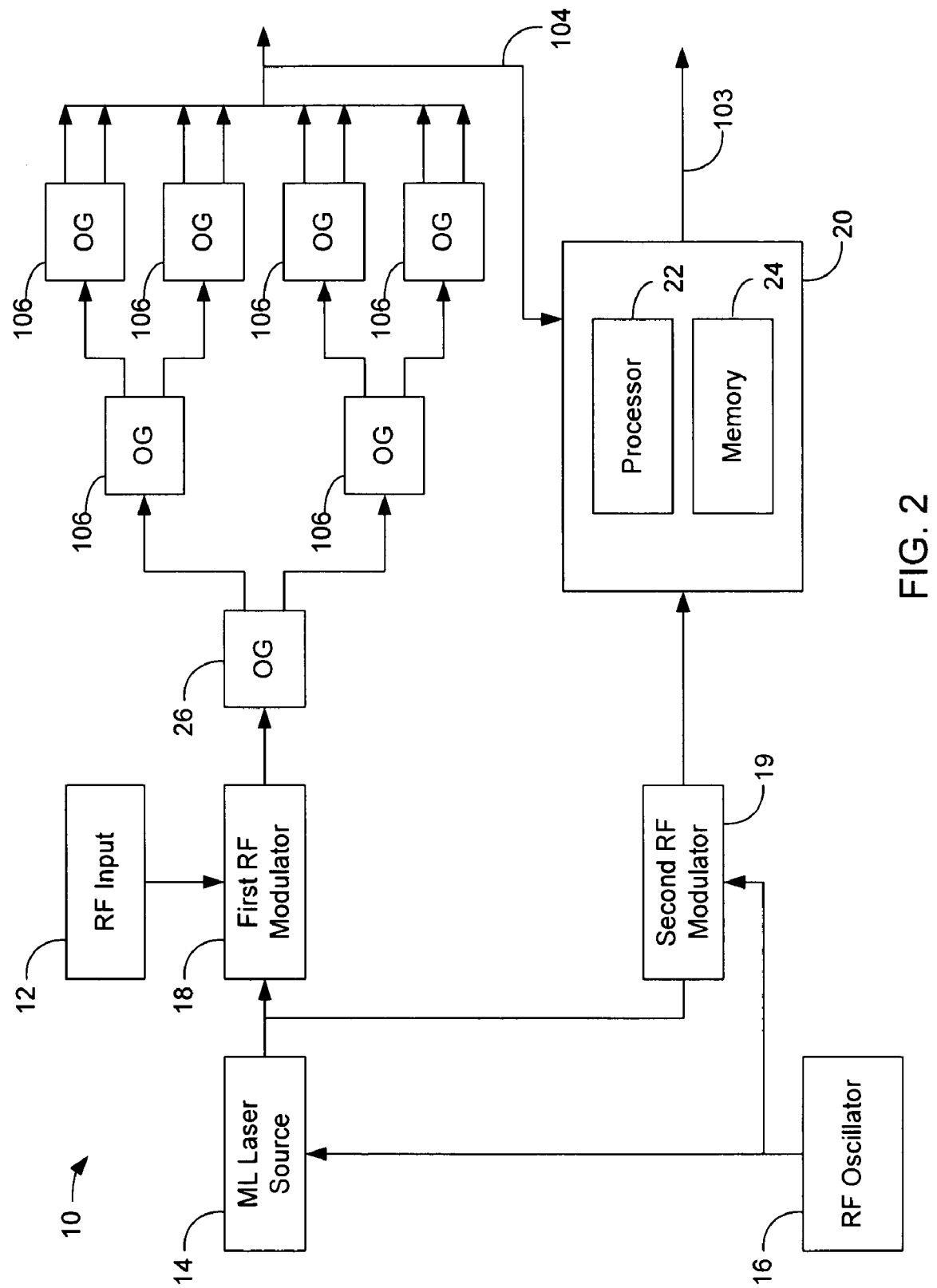
FIG. 2 is another block diagram of the analog-to-digital converter, according to one exemplary embodiment.

In FIG. 2, another block diagram of analog-to-digital converter 10 is shown, according to one exemplary embodiment. Analog-to-digital converter 10 may include a first optical gate 26 and a plurality of optical gates 106. Monitoring device 20 may transmit modification data via a first communication link 103, according to an exemplary embodiment. Monitoring device 20 may receive reference radio frequency modulator data from second radio frequency modular 19 and radio frequency modulator data from either first optical gate 26, plurality of optical gates 106, or any combination thereof via a fourth communication link 104 to generate modification data as detailed below.

Figure 3:
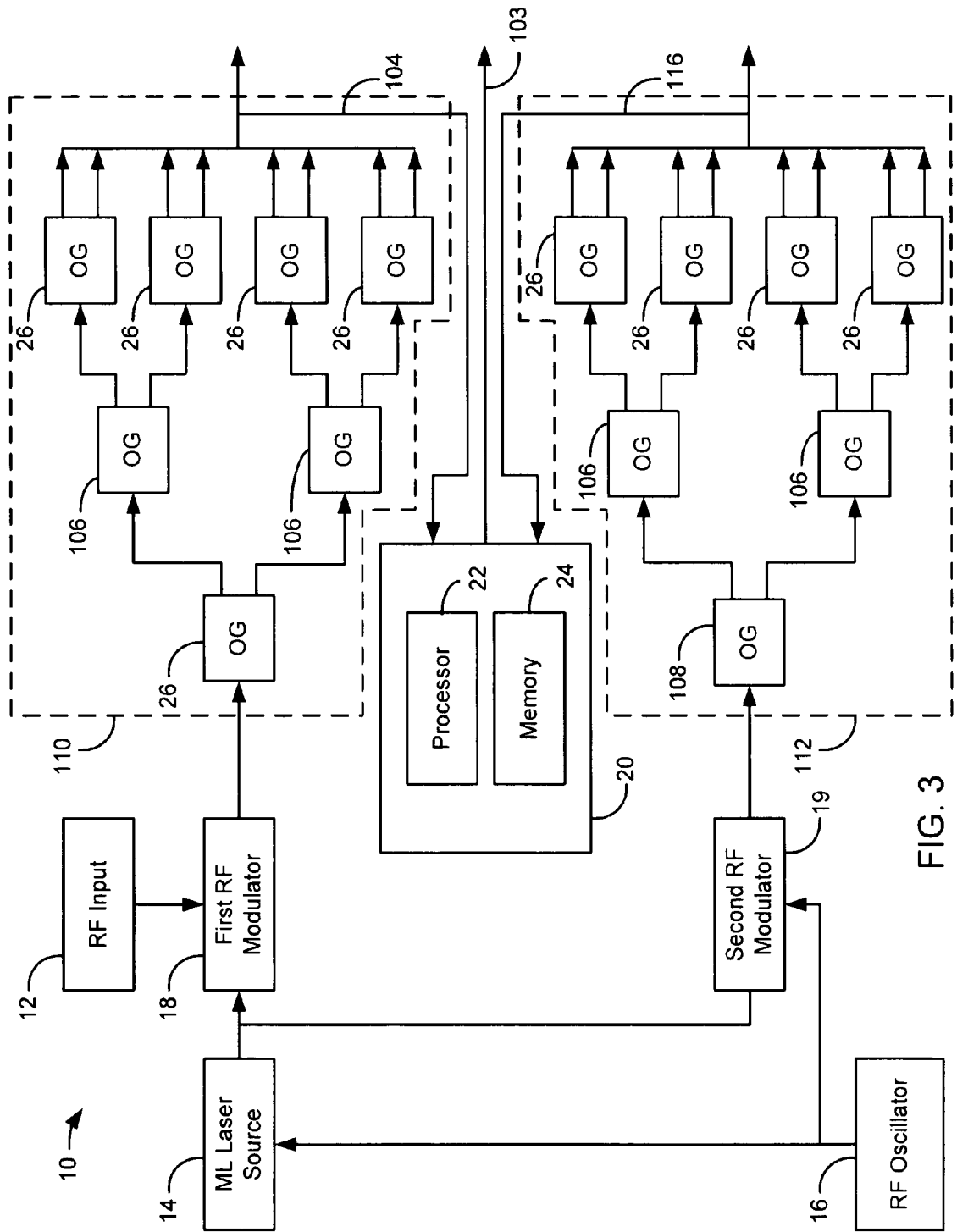
FIG. 3 is another block diagram of the analog-to-digital converter, according to one exemplary embodiment.

In FIG. 3, another block diagram of analog-to-digital converter 10 is shown, according to one exemplary embodiment. Analog-to-digital converter 10 may include a first optical gate group 110. First optical gate group 110 may include first optical gate 26 and plurality of optical gates 106. Analog-to-digital converter 10 may include a second optical gate group 112. Second optical gate group 112 may include a second optical gate 108 and plurality of optical gates 106. Monitoring device 20 may receive reference radio frequency modulator data from second optical gate group 112 via a fifth communication link 116 and radio frequency modulator data from first optical gate group 110 via fourth communication link 104 to generate modification data as detailed below.

Figure 4:
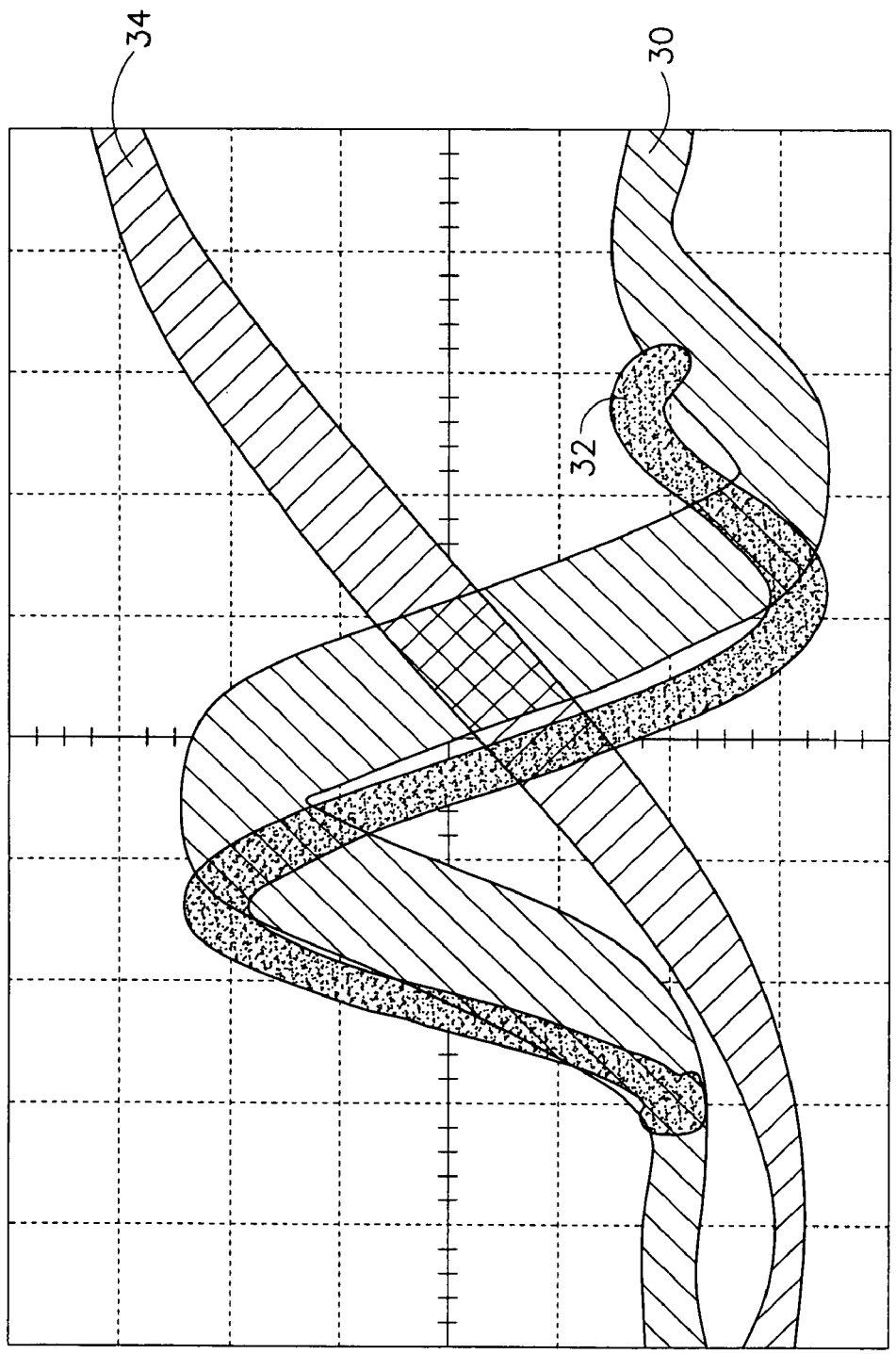
FIG. 4 is a graph highlighting the signal generator data, the modified signal, and the unmodified signal, according to an exemplary embodiment.

In FIG. 4, a graph highlighting a generator signal 34, modified signal 32, and unmodified signal 30 is shown, according to an exemplary embodiment. Generator signal 34 may be utilized to obtain modification data. The modification data may be utilized to modify/correct/adjust unmodified signal 30 to obtain modified signal 32.

Figure 5:
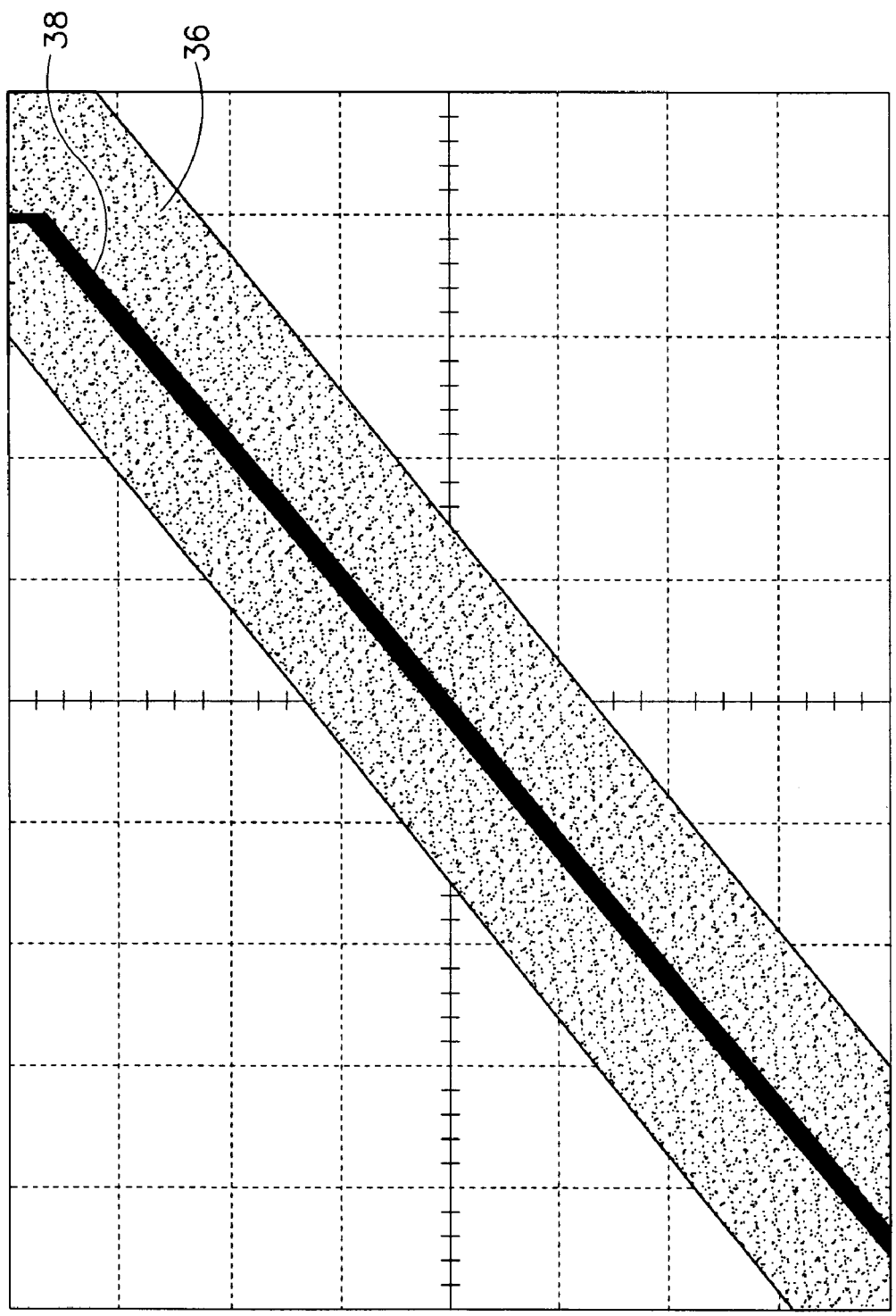
FIG. 5 is another graph showing the modified signal versus the unmodified signal, according to one exemplary embodiment.

In FIG. 5, another graph showing modified signal 32 versus unmodified signal 30 is shown, according to one exemplary embodiment. In this exemplary embodiment, the jitter is approximately 50 fs which may be obtained by plotting the signal versus generator signal 34.

Figure 6A:
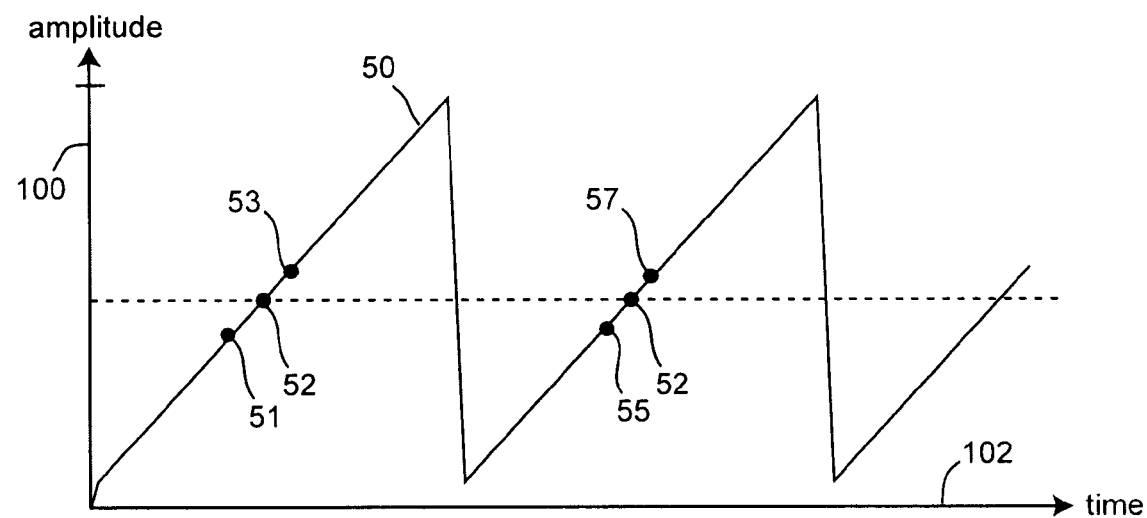
FIG. 6A is a sawtooth wave utilized to determine the modification data, according to an exemplary embodiment.

In FIG. 6A, a sawtooth wave 50 utilized to determine the modification data is shown, according to an exemplary embodiment. A reference point 52 is shown on sawtooth wave 50. Reference point 52 may be the point on the curve where no modification data would be generated. In an exemplary embodiment, no modification data may be generated when the sample data does not need to be adjusted (e.g., no timing error) and/or when the adjustment is within a predetermined range.

In an exemplary embodiment, first sample 51 may lead reference point 52. Since first sample 51 leads reference point 52, monitoring device 20 may determine the timing error associated with first sample 51 based on a voltage and timing error relationship. In another exemplary embodiment, second sample 53 lags reference point 52. Since second sample 53 lags reference point 52, monitoring device 20 may determine a different timing error associated with second sample 53 based on the voltage and timing error relationship. The timing errors may be applied to the real data using the curve fit shown in FIG. 7, according to an exemplary embodiment.

In another exemplary embodiment, a third sample 55 may lead reference point 52. Since third sample 55 leads reference point 52, monitoring device 20 may determine the timing error associated with third sample 55 based on the voltage and timing error relationship. In this exemplary embodiment, third sample 55 leads reference point 52 by a lead value that is less than the lead value associated with first sample 51 and reference point 52. Therefore, third sample 55 may have a timing error which is less than or more than the timing error associated with first sample 51. In another exemplary embodiment, a fourth sample 57 lags reference point 52. Since fourth sample 57 lags reference point 52, monitoring device 20 may determine a different timing error associated with fourth sample 57 based on the voltage and timing error relationship. In this exemplary embodiment, fourth sample 57 lags reference point 52 by a lag value that is less than the lag value associated with second sample 53 and reference point 52. Therefore, fourth sample 57 may have a timing error which is less than or more than the timing error associated second sample 53. These timing errors may be applied to the real data using the curve fit shown in FIG. 7, according to an exemplary embodiment.

In another exemplary embodiment, a first sample 51 may lead reference point 52. Since first sample 51 leads reference point 52, monitoring device 20 may determine that the amplitude value (e.g., voltage, current, etc.) associated with first sample 51 may need to be modified because the amplitude value is too low, according to an exemplary embodiment. Monitoring device 20 may determine the modification data based on the timing error, the sample's value, and reference point 52. In another exemplary embodiment, a second sample 53 lags reference point 52. Since second sample 53 lags reference point 52, monitoring device 20 may determine that the amplitude value (e.g., voltage, current, etc.) associated with second sample 53 may need to be modified because the amplitude value is too high, according to an exemplary embodiment.

In an exemplary embodiment, first sample 51 may lead reference point 52. Since first sample 51 leads reference point 52, monitoring device 20 may determine that the amplitude value (e.g., voltage, current, etc.) associated with first sample 51 may need to be modified because the amplitude value is too high, according to an exemplary embodiment. In another exemplary embodiment, second sample 53 lags reference point 52. Since second sample 53 lags reference point 52, monitoring device 20 may determine that the amplitude value (e.g., voltage, current, etc.) associated with second sample 53 may need to be modified because the amplitude value is too low, according to an exemplary embodiment.

In another exemplary embodiment, a third sample 55 may lead reference point 52. Since third sample 55 leads reference point 52, monitoring device 20 may determine that the amplitude value (e.g., voltage, current, etc.) associated with third sample 55 may need to be modified because the amplitude value is too low, according to an exemplary embodiment. In this exemplary embodiment, third sample 55 leads reference point 52 by a lead value that is less than the lead value associated with first sample 51 and reference point 52. Therefore, third sample 55 may need to be modified by less than or more than first sample 51. In another exemplary embodiment, a fourth sample 57 lags reference point 52. Since fourth sample 57 lags reference point 52, monitoring device 20 may determine that the amplitude value (e.g., voltage, current, etc.) associated with fourth sample 57 may need to be modified because the amplitude value is too high, according to an exemplary embodiment. In this exemplary embodiment, fourth sample 57 lags reference point 52 by a lag value that is less than the lag value associated with second sample 53 and reference point 52. Therefore, fourth sample 57 may need to be modified by less than or more than second sample 53.

Figure 6B:
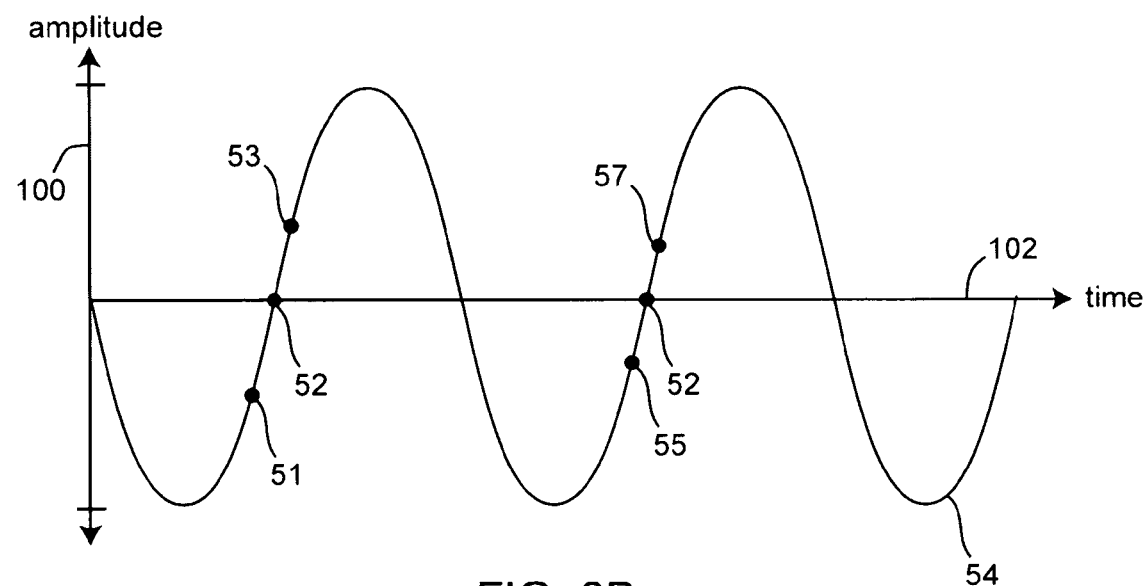
FIG. 6B is a sine wave utilized to determine the modification data, according to an exemplary embodiment.

In FIG. 6B, a sine wave 54 utilized to determine the modification data is shown, according to an exemplary embodiment. The embodiments utilized with sawtooth wave 50 may also be utilized with sine wave 54, according to exemplary embodiments.

Figure 7:
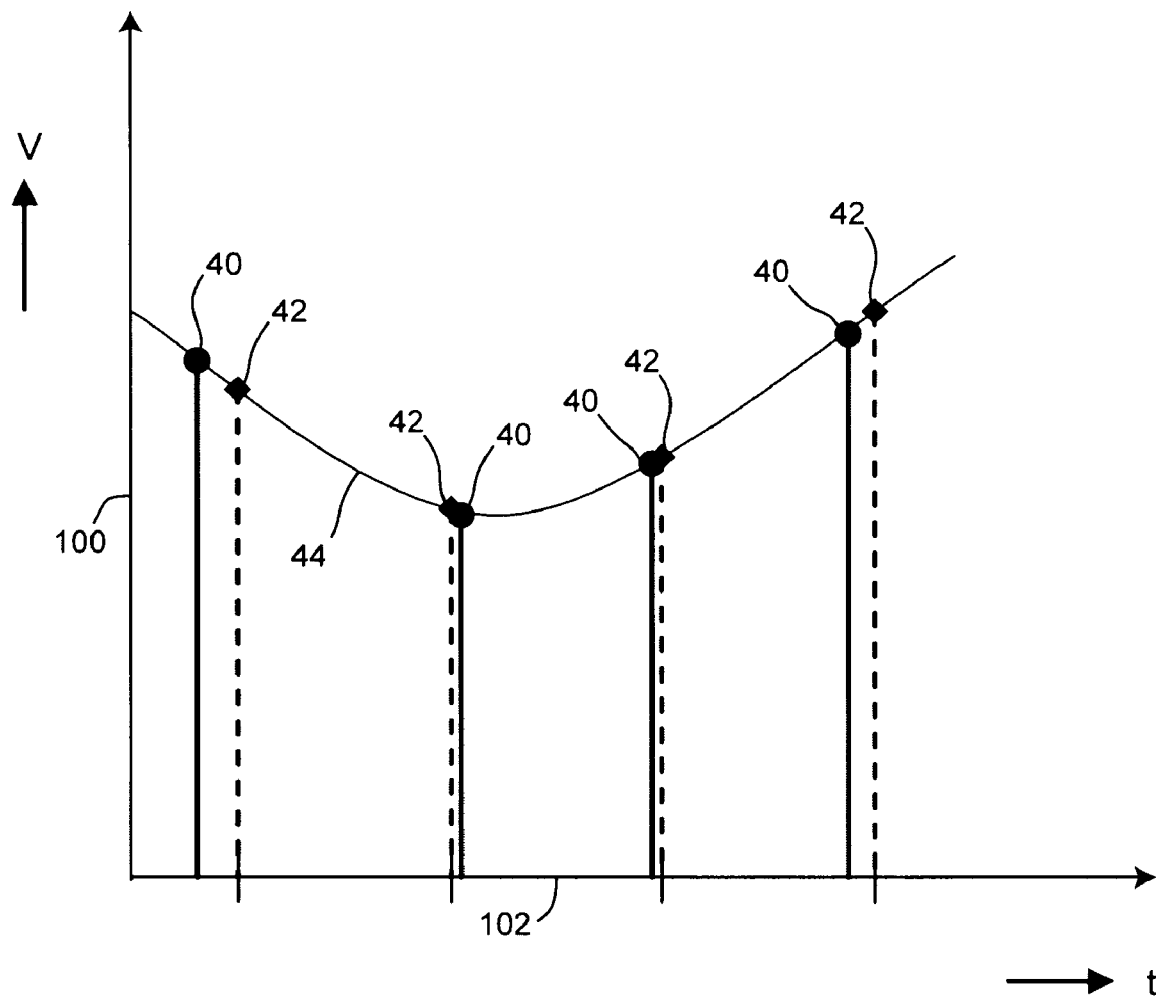
FIG. 7 is a graph showing the unmodified data points, the modified data points, and the modification curve, according to an exemplary embodiment.

In FIG. 7, a graph showing the unmodified data points, the modified data points, and the modification curve is shown, according to an exemplary embodiment. In an exemplary embodiment, samples 40 (e.g., voltage, current, etc.) may be obtained together with a measurement of the timing error of each sample (e.g., $\Delta t$). A curve may be fitted to a number of measured samples 40 obtained (e.g., $V_k$, $\Delta t_k$). A fitted curve 44 where V1=f(t) may be used to generated corrected samples 42 where $\Delta t=0$. Fitted curve 44 is plotted on a x-y graph where voltage may be utilized on y-axis 100 and time may be utilized on x-axis 102. In an exemplary embodiment, a repetitive method may be utilized to continuously correct samples 40.

Figure 8:
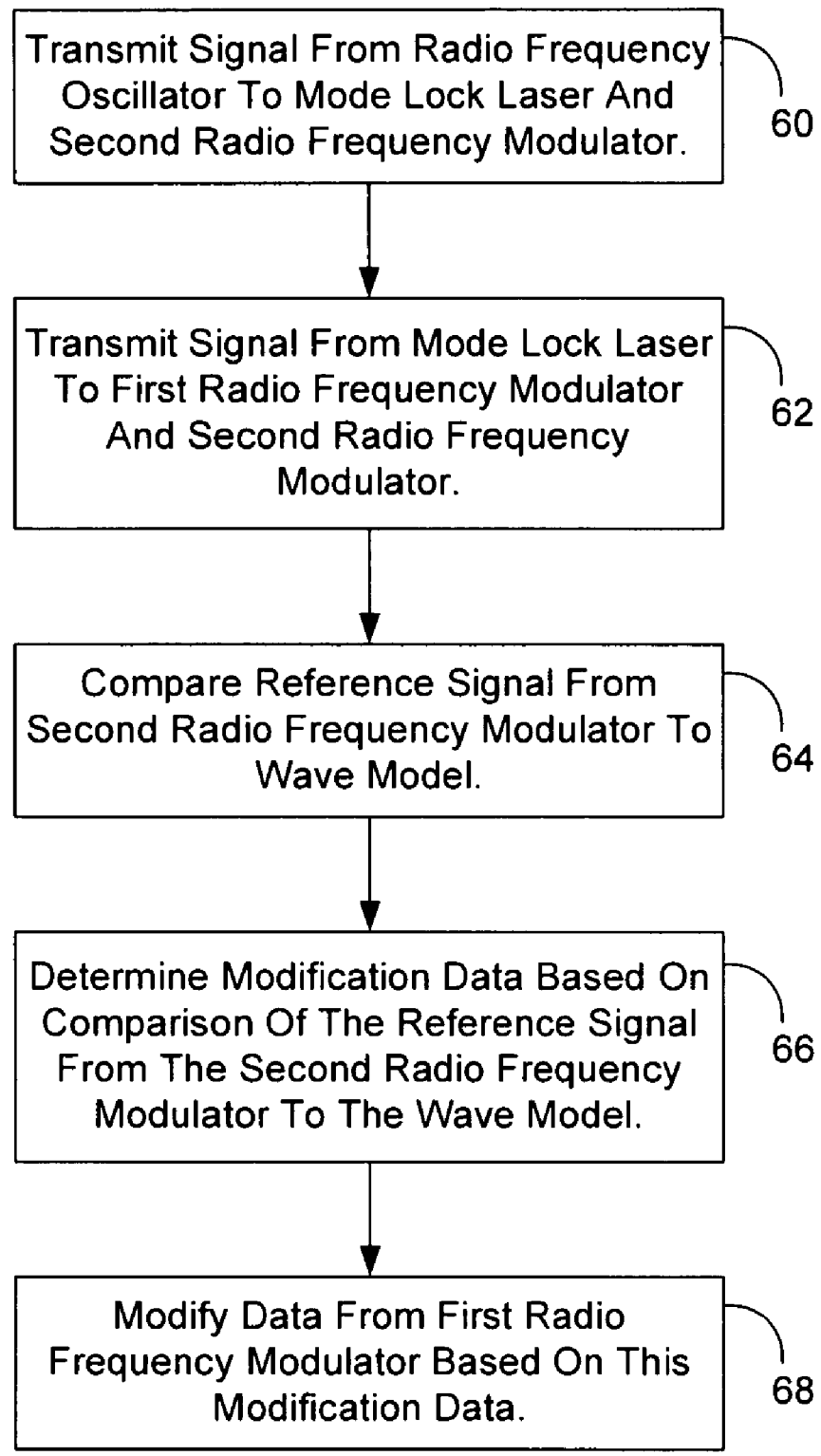
FIG. 8 is a flowchart disclosing a process to determine the modification data, according to an exemplary embodiment.

In FIG. 8, a flowchart disclosing a process to determine the modification data is shown, according to an exemplary embodiment. According to an exemplary method, a signal may be transmitted from radio frequency oscillator 16 to mode lock laser source 14 and to second radio frequency modulator 19 (step 60). Mode lock laser source 14 may transmit data to first radio frequency modulator 18 and second radio frequency modulator 19 (step 62). Monitoring device 20 may compare reference signal from second radio frequency modulator 19 to wave model (step 64). Monitoring device 20 may determine modification data based on comparison of the reference signal from second radio frequency modulator 19 to the wave model (step 66). Monitoring device 20 may modify data from first radio frequency modulator 18 based on the modification data (step 68).

Figure 9:
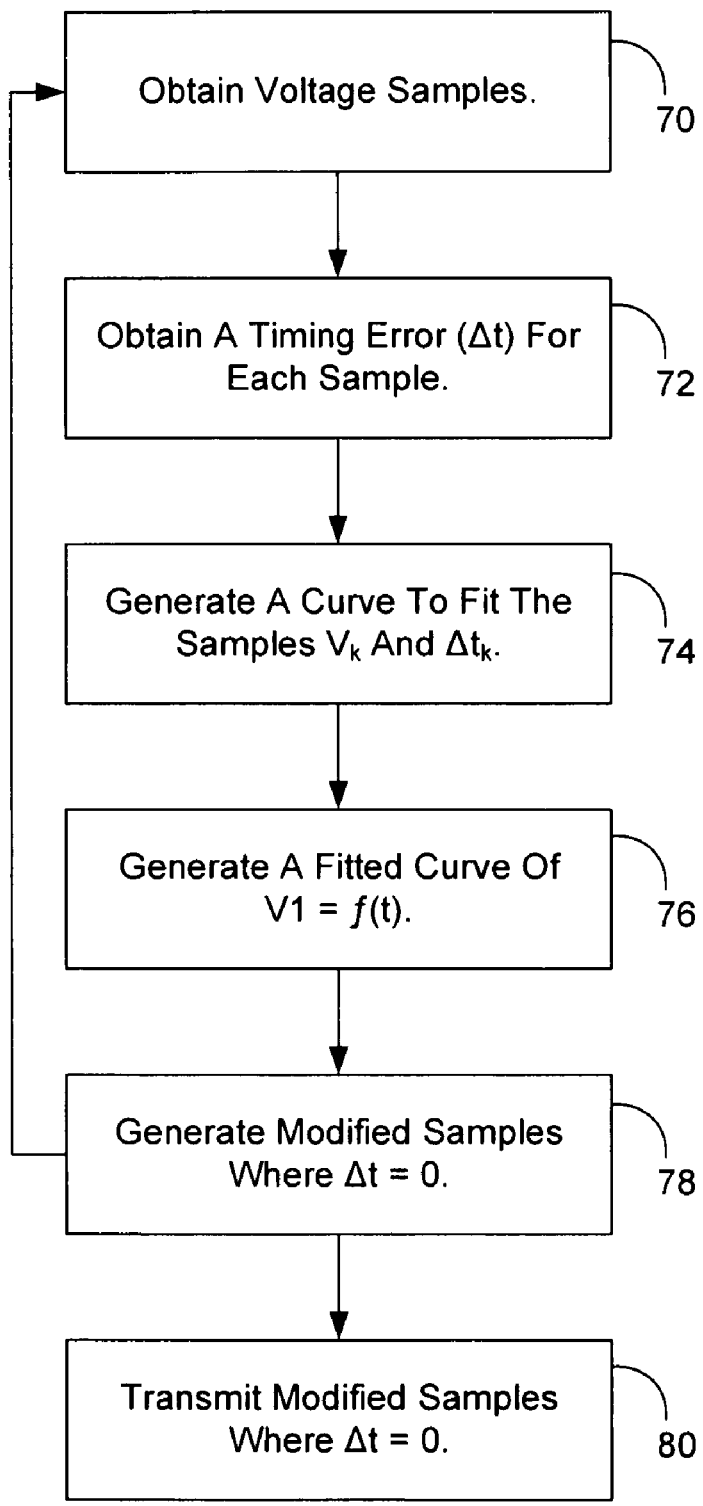
FIG. 9 is another flowchart a process to determine the modification data, according to an exemplary embodiment.

In FIG. 9, another flowchart a process to determine the modification data is shown, according to an exemplary embodiment. According to an exemplary method, samples (e.g., voltage, current, etc.) may be obtained (step 70). Monitoring device 20 may obtain a timing error for each sample (step 72). Monitoring device 20 may generate a curve to fit the samples (step 74). Monitoring device 20 may generate a fitted curve of V1=f(t) (step 76). Monitoring device 20 may generate modified samples where $\Delta t=0$ (step 78). Monitoring device 20 may transmit modified samples where $\Delta t=0$ (step 80). This process may be an iterative process where the system obtains more samples which is shown at step 78. It should be noted that this iterative step may be anywhere in the process.

By measuring the radio frequency signal of interest while at the same time monitoring a reference signal source, the system may correct for any timing induced uncertainty such as uncertainty due to pulse jitter.

Although specific steps are shown and described in a specific order, it is understood that the method may include more, fewer, different, and/or a different ordering of the steps to perform the function described herein.

The exemplary embodiments illustrated in the figures and described herein are offered by way of example only. Accordingly, the present application is not limited to a particular embodiment, but extends to various modifications that nevertheless fall within the scope of the appended claims. The order or sequence of any processes or method steps may be varied or re-sequenced according to alternative embodiments.

The present application contemplates methods, systems and program products on any machine-readable media for accomplishing its operations. The embodiments of the present application may be implemented using an existing computer processor, or by a special purpose computer processor for an appropriate system, incorporated for this or another purpose or by a hardwired system.

It is important to note that the construction and arrangement of the analog-to digital converter system as shown in the various exemplary embodiments is illustrative only. Although only a few embodiments of the present application have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors and orientations) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application as defined in the appended claims. The order or sequence of any process or method steps may be varied or re-sequenced according to alternative embodiments. In the claims, any means-plus-function clause is intended to cover the structures described herein as performing the recited function and, not only structural equivalents, but also equivalent structures. Other substitutions, modifications, changes and omissions may be made in the design, operating conditions and arrangement of the exemplary embodiments without departing from the scope of the present application as expressed in the appended claims.

As noted above, embodiments within the scope of the present application include program products comprising machine-readable media for carrying or having machine-executable instructions or data structures stored thereon. Such machine-readable media can be any available media which can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store a desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions comprise, for example, instructions and data which cause a general purpose computer, special purpose computer, or special purpose processing machines to perform a certain function or group of functions.

The foregoing description of embodiments of the application has been presented for purposes of illustration and description. It is not intended to be exhaustive or to limit the application to the precise form disclosed, and modifications and variations are possible in light of the above teachings, or may be acquired from practice of the application. The embodiments were chosen and described in order to explain the principles of the application and its practical application to enable one skilled in the art to utilize the application in various embodiments and with various modifications as are suited to the particular use contemplated. The scope of this application should be determined by the claims, their legal equivalents, and the fact that it fully encompasses other embodiments which may become apparent to those skilled in the art.

What is claimed is:

1. A monitoring device in an analog-to-digital converter, the monitoring device comprising:
    a monitoring module configured to receive a first radio frequency signal provided by a first radio frequency modulator and a second radio frequency signal provided by a second radio frequency modulator, the first radio frequency signal being associated with a laser signal and a radio frequency input signal, the laser signal being associated with a radio frequency oscillator signal, the second radio frequency signal being associated with the laser signal and the radio frequency oscillator signal;
    wherein the monitoring module being configured to determine a modification factor based on the first radio frequency signal and the second radio frequency signal.

2. The monitoring device of claim 1, wherein the modification factor is associated with the radio frequency input signal.

3. The monitoring device of claim 1, wherein the modification factor is associated with the first radio frequency signal.

4. The monitoring device of claim 1, wherein the radio frequency oscillator signal is based on a sawtooth wave.

5. The monitoring device of claim 1, wherein the radio frequency oscillator signal is based on a sine wave.

6. The monitoring device of claim 1, wherein the monitoring module is configured to modify data associated with the first radio frequency signal based on the modification factor.

7. The monitoring device of claim 1, wherein the monitoring module is configured to modify data associated with the radio frequency input signal based on the modification factor.

8. A method for monitoring data in an analog-to-digital converter, comprising:
    providing a radio frequency oscillator data to a laser source and a reference radio frequency modulator;
    providing laser data from the laser source to a radio frequency modulator and the reference radio frequency modulator;

providing a radio frequency input data to the radio frequency modulator;

generating a radio frequency modulator data;

generating a reference radio frequency modulator data;

comparing the reference radio frequency modulator data to the radio frequency modulator data; and determining a modification data based on a comparison of the reference radio frequency modulator data to the radio frequency modulator data.

9. The method of claim 8, wherein the radio frequency modulator data is a wave model.

10. The method of claim 9, wherein the wave model is a sawtooth wave model.

11. The method of claim 9, wherein the wave model is a sine wave model.

12. The method of claim 8, further comprising comparing a wave model data to at least one of the reference radio frequency modulator data and the radio frequency modulator data.

13. The method of claim 12, wherein the wave model data is associated with the radio frequency input data.

14. A monitoring device in an analog-to-digital converter, the monitoring device comprising:

means for providing a radio frequency oscillator sample to a laser source and a reference radio frequency modulator;

means for providing a laser sample from the laser source to a radio frequency modulator and the reference radio frequency modulator;

means for providing a radio frequency input sample to the radio frequency modulator;

means for generating a radio frequency modulator data;

means for generating a reference radio frequency modulator data;

means for comparing the reference radio frequency modulator data to the radio frequency modulator data; and means for determining a modification data based on a comparison of the reference radio frequency modulator data to the radio frequency modulator data.

15. The monitoring device of claim 14, wherein the modification factor is associated with the radio frequency input sample.

16. The monitoring device of claim 14, wherein the modification factor is associated with the radio frequency modulator data.

17. The monitoring device of claim 14, wherein the radio frequency oscillator sample is based on a sawtooth wave.

18. The monitoring device of claim 14, wherein the radio frequency oscillator sample is based on a sine wave.

19. The monitoring device of claim 14, wherein the monitoring module is configured to modify data associated with the radio frequency modulator data based on the modification factor.

20. The monitoring device of claim 14, wherein the monitoring module is configured to modify data associated with the radio frequency input sample based on the modification factor.

* * * * *